(12) United States Patent
Mulder et al.

(10) Patent No.: US 7,170,701 B2
(45) Date of Patent: Jan. 30, 2007

(54) AMPLIFIER WITH A STRONG OUTPUT CURRENT

(75) Inventors: Jan Mulder, Houten (NL); Hugo Veenstra, Eindhoven (NL); Giuseppe Grillo, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 381 days.

(21) Appl. No.: 10/179,356

(22) Filed: Jun. 25, 2002

(65) Prior Publication Data

US 2003/0007271 A1   Jan. 9, 2003

(30) Foreign Application Priority Data

Jun. 26, 2001   (FR) .................................. 01 08417

(51) Int. Cl.
 *G11B 5/09*   (2006.01)
(52) U.S. Cl. ..................................................... 360/46
(58) Field of Classification Search ............. 330/61 R, 330/62, 261, 26; 360/66, 67; 324/210, 212
 See application file for complete search history.

(56) References Cited

U.S. PATENT DOCUMENTS 4,626,794 A * 12/1986 Sugimoto ................... 330/253
RE32,749 E * 9/1988 Bohme ....................... 330/261
5,337,010 A * 8/1994 Nishiyama .................. 330/255
5,852,521 A * 12/1998 Umeyama et al. ............ 360/46
5,859,674 A * 1/1999 Chevallier .................. 348/731
6,064,261 A * 5/2000 Stein et al. .................. 330/252

OTHER PUBLICATIONS

"Analysis and Design of Analog Integrated Circuits" Messrs. Gray and Meijer, p. 380 and 426, no date.

* cited by examiner

*Primary Examiner*—Wayne Young
*Assistant Examiner*—Glenda Rodriguez

(57) ABSTRACT

The present invention relates to an amplifier intended to deliver to a load impedance RL connected between two output terminals of the amplifier an output current Iout which is representative of an input signal (Vin, −Vin) applied to two input terminals of the amplifier, which amplifier includes a first and a second transistor T1 and T2 connected as a differential pair around the load impedance RL. The amplifier according to the invention further includes a third and a fourth transistor T3 and T4 which form a differential pair; degenerated by means of a degenerating impedance Req which has a nominal value equal to that of the load impedance RL of the amplifier, which differential pair (T3, T4) is intended to be controlled by means of a control signal (−Vin/2, Vin/2), in anti-phase with the input signal (Vin, −Vin). The invention permits to double the output current Iout of the amplifier without, however, increasing its power consumption.

4 Claims, 2 Drawing Sheets

AMPLIFIER WITH A STRONG OUTPUT CURRENT

Figure 1:
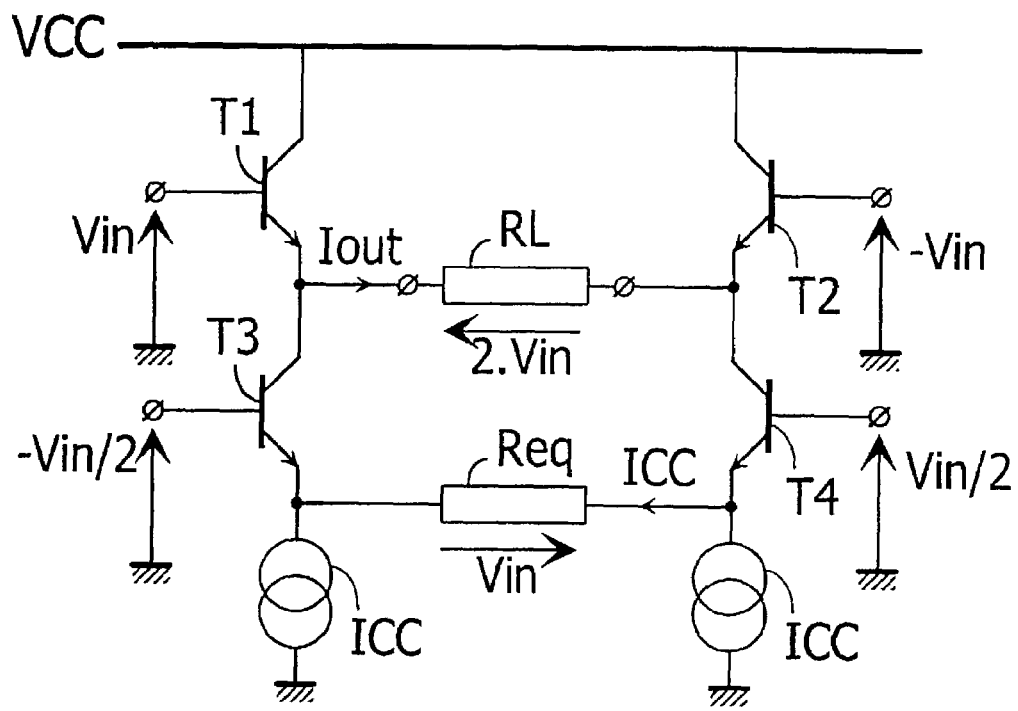

The present invention relates to an amplifier intended to deliver to a load impedance connected between two output terminals of the amplifier an output current that is representative of an input signal applied to two input terminals of the amplifier.

Such amplifiers may be used in a multiplicity of applications, inter alia for realizing an amplification of an input signal intended to control a write head in a data storage device. In a device of this type the data are sent to the write head in the form of pulses present in an A.C. component of the input signal. The amplification which the input signal undergoes confers on this signal a larger power and permits it to control the write head more efficiently.

A simple structure capable of realizing such amplification consists of a differential pair degenerated by means of the load impedance and biased by means of two identical current sources. In this embodiment of the conventional differential pair the maximum value of the output current is equal to the value of the current produced by each current source.

Other solutions permit to increase the maximum output current of the amplifier, such as the use of structures of class AB described on pp. 380 and 426 of the publication entitled "Analysis and Design of Analog Integrated Circuits" by Messrs Gray and Meijer, but such structures call for transistors which have different conductivity types among them, for example, NPN and PNP types, the latter being expensive to manufacture, which causes the amplifier thus obtained to have a more complex structure and a much higher cost price than that of the conventional differential pair described above.

It is an object of the invention to permit a higher output current than that of the conventional differential pair by means of an amplifier which has a cost price that is lower than that of the structures of class AB.

In fact, according to the invention, an amplifier in accordance with the introductory paragraph includes:
- a first and a second transistor having a bias terminal and a reference terminal which form the input terminal and output terminal respectively of the amplifier, and
- a third and a fourth transistor having transfer terminals connected to the output terminals and forming a differential pair degenerated by means of a degenerating impedance which has a nominal value equal to that of the load impedance of the amplifier, which differential pair is intended to be controlled by a control signal in anti-phase with the input signal.

In the following of the description it will be demonstrated that the structure of the amplifier according to the invention permits with equal power consumption to double the maximum value of the output current relative to that of the conventional differential pair. For that matter, the first, second, third and fourth transistors may all be of the same type, which makes it possible not to increase the manufacturing costs of the amplifier according to the invention in a significant way compared to that of the conventional differential pair.

As explained previously, the invention permits efficient control of a write head in a data storage device. The invention thus also relates to a control circuit of a write head intended to generate a magnetic field on a surface of a magnetic data medium, the control circuit including an amplifier as described above whose output terminals are connected to the write head via connection means and whose degenerating impedance has a nominal value equal to an input impedance of the connection means.

In such an embodiment the invention also relates to a data storage device including:
- a medium having a surface on which the data are to be stored in the form of local magnetic fields.
- a write head capable of movements which are co-planar to said surface and
- a control circuit for said write head as described above.

These and other aspects of the invention are apparent from and will be elucidated, by way of non-limitative example, with reference to the embodiment(s) described hereinafter.

Figure 2:
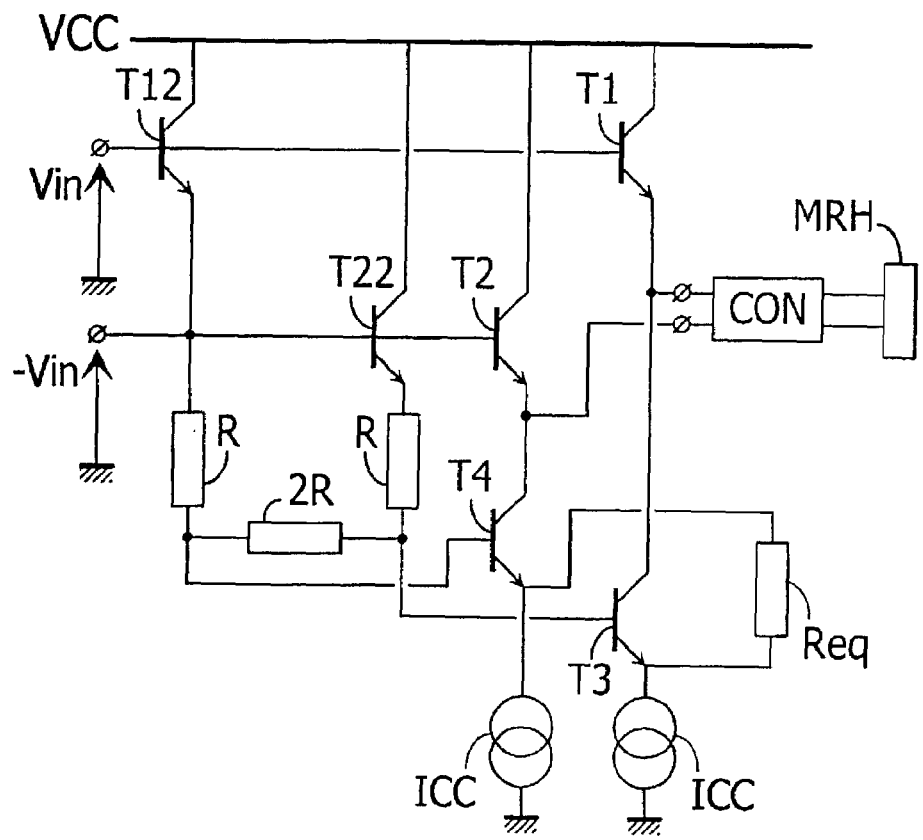
Figure 3:
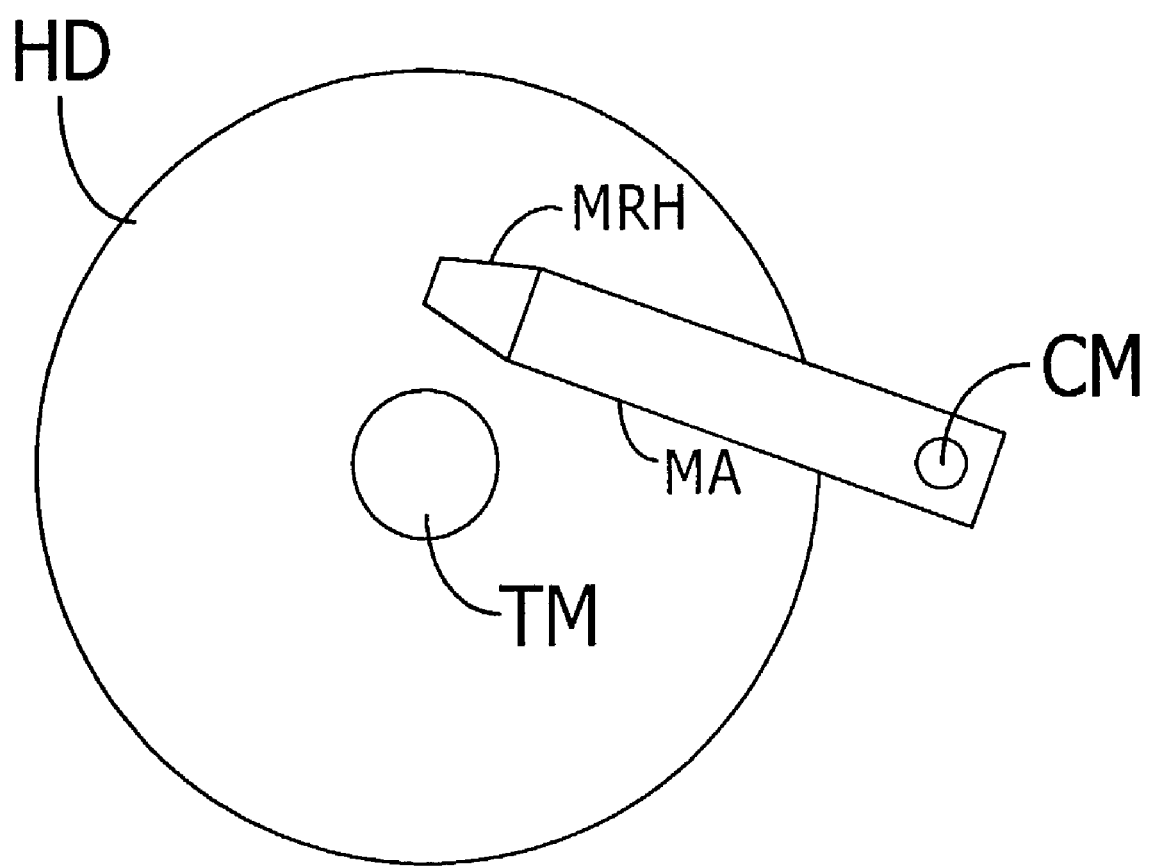

In the drawings:

FIG. 1 is an electrical diagram describing an amplifier which implements the invention, FIG. 2 is an electrical diagram describing partly a control circuit implementing the invention and FIG. 3 is a diagram describing a data storage device in which the invention will advantageously be implemented.

FIG. 1 is an electrical diagram which represents an amplifier intended to deliver to a load impedance RL connected between two output terminals of the amplifier an output current Iout which is representative of an input signal (Vin, −Vin) applied to two input terminals of the amplifier, which amplifier includes:
- a first and a second transistor T1 and T2 having a bias and a reference terminal which respectively form the input terminal and the output terminal of the amplifier and
- a third and a fourth transistor T3 and T4 each having a transfer terminal connected to the output terminals and forming a differential pair degenerated by means of a degenerating impedance Req which has a nominal value equal to that of the load impedance RL of the amplifier, which differential pair (T3, T4) is intended to be controlled by means of a control signal (−Vin/2, Vin/2) in anti-phase with the input signal (Vin, −Vin).

The differential pair formed by the third and fourth transistors T3 and T4 is biased by means of two current sources ICC connected to the transfer terminals of said transistors. In the example described here the first, second, third and fourth transistors T1, T2, T3 and T4 are all realized in bipolar technology and have a base, collector and an emitter which constitute their bias terminal, transfer terminal and reference terminal, respectively. In another embodiment it is perfectly feasible to exchange them for MOS-type transistors whose gates, drains and sources would constitute the bias terminal, transfer terminal and reference terminal, respectively.

The transistors included in the amplifier according to the invention being all of the same type, they may be realized simultaneously according to a like manufacturing method. The realization of a transistor having opposite conductivity, that is to say, a PNP transistor in this example, would imply additional steps in the manufacturing method, a PNP transistor generally being realized in vertical form which makes it necessary to have ground layers in a substrate of an integrated circuit which would contain all the elements of the amplifier, buried layers the realization of which would add considerable cost to the manufacturing cost of a circuit that only contains NPN transistors.

In an amplifier formed by a conventional differential pair, the third and fourth transistors would be absent, the current sources ICC thus being directly connected to the emitters of the first and second transistors T1 and T2. Such an amplifier would then receive a power equal to 2. Vin.ICC and the output current Iout would then be limited by the value of the current ICC supplied by each current source because in a situation of total unbalance of the pair formed by the first and second transistors T1 and T2, a single current source would cause the output current Iout to be drained through the load impedance RL as a function of the sign of the input signal (Vin, −Vin) alternating with the other current source.

In the amplifier according to the invention each third or fourth transistor T3 and T4 is alternately, as a function of the sign of their control signal (−Vin/2, Vin/2), a conductor of the sum of the currents simultaneously supplied by the two current sources ICC in situations of total unbalance of the pair formed by the third and fourth transistors T3 and T4, the current Iout then being positive or negative as a function of the sign of the input signal (Vin, −Vin) which controls the conduction of the first and second transistors T1 and T2. The fact that the input and control signals (Vin, −Vin) and (−Vin/2, Vin/2) are in anti-phase permits to avoid that the output current Iout is not directly deviated to ground via either one of the third and fourth transistors T3 and T4.

Thus, although the power consumption by the amplifier according to the invention is always equal to 2. Vin.ICC, the load impedance RL may be passed through by an output current Iout whose maximum value is equal to 2. ICC. The maximum output current Iout that the amplifier according to the invention is capable of supplying to the load impedance RL is thus, with equal power consumption, twice as large as that which a conventional differential pair is capable of producing, such an increase being obtained without, however, increasing the total energy consumption of the amplifier.

In the example described here, for reasons of stability, the control signal (−Vin/2, Vin/2) has an amplitude that is twice as low as that of the input signal (Vin, −Vin). This permits to ensure that the current flowing through the degenerating impedance Req, whose value is close to that of the load impedance RL, that is equal to Vin/Req=Vin/RL=ICC maximum, the current flowing through either of the third and fourth transistors T3 or T4 being equal to 2. ICC, whereas the output current Iout passing through the load impedance RL is at most equal to 2. Vin/Req=2. Vin/RL=2. ICC.

FIG. 2 is an electrical diagram which represents a control circuit of a write head MRH intended to generate a magnetic field on a surface of a magnetic data medium, the control circuit including an amplifier as described above whose output terminals are connected to the write head MRH via connection means CON.

The amplifier included in this control circuit comprises first, second, third and fourth transistors T1, T2, T3 and T4 in accordance with the preceding description.

The connection means CON generally including conductor wires which have a non-zero intrinsic resistance show, in combination with the write head MRH, an input impedance seen from the terminals of the connection means CON, that forms the load impedance of the amplifier to which the degenerating impedance Req is equal as a nominal value. It has previously been demonstrated that this permits to double the maximum value of the current that the amplifier is able to deliver to the write head MRH, which renders the control of said head more efficient without significantly increasing the cost price of the control circuit.

In this embodiment the amplifier included in the control circuit has a first and second voltage divider bridge R/2R, arranged between the bias terminals of the first and fourth transistors T1 and T4, on the one hand, and between the bias terminals of the second and third transistors T2 and T3 on the other, via additional transistors T12 and T22 which ensure that the operation of the divider bridges R/2R does not disturb that of the first and second transistors T1 and T2. These divider bridges R/2R permit to realize in a simple manner the operating conditions and stability according to which the control signal controlling the differential pair formed by the third and fourth transistors T3 and T4 is in anti-phase with the input signal (Vin, −Vin) and has an amplitude that is twice as low as the latter.

FIG. 3 illustrates a data storage device including:
a medium HD, for example, a magnetic disc, having a surface on which the data are to be stored in the form of local magnetic fields caused to rotate by a motor TM.
a write head MRH capable of co-planar movements to said surface and for this purpose moved by a motor CM intended to print a rotary movement with a supporting arm MA of the write head MRH.

Because of the large amplitude of the output current that can be obtained with the invention, this device will advantageously be provided with a control circuit as described previously for controlling the write head MRH.

The invention claimed is:
1. A circuit, comprising:
a first transistor coupled collector-to-emitter between a first power supply node and a first output node;
a second transistor coupled collector-to-emitter between the first power supply node and a second output node;
a third transistor coupled collector-to-emitter between the first output node and a first current source;
a fourth transistor coupled collector-to-emitter between the second output node and a second current source;
a first load element coupled between the first output node and the second output node; and
a second load element coupled between the first current source and the second current source.
2. The circuit of claim 1, wherein the first load element and the second load element have substantially the same impedance.
3. The circuit of claim 1, wherein a first signal source is coupled to a base terminal of the first transistor, and a second signal source is coupled to a base terminal of the second transistor;
wherein the first signal source and the second signal source are operable to provide signals that are in anti-phase with respect to each other.
4. The circuit of claim 1, wherein a third signal source is coupled to a base terminal of the third transistor, and a fourth signal source is coupled to a base terminal of the fourth transistor;
wherein the third signal source and the fourth signal source are operable to provide signals that are in anti-phase with respect to each other; and wherein the signal provided by third signal source is in anti-phase with respect to the signal provided by the first signal source.

* * * * *